United States Patent
Wormmeester

(10) Patent No.: US 9,467,140 B2
(45) Date of Patent: Oct. 11, 2016

(54) FIELD-EFFECT TRANSISTOR DRIVER

(71) Applicant: Honeywell International Inc., Morristown, NJ (US)

(72) Inventor: Erik Wormmeester, DenBosch (NL)

(73) Assignee: Honeywell International Inc., Morris Plains, NJ (US)

( * ) Notice: Subject to any disclaimer, the term of this patent is extended or adjusted under 35 U.S.C. 154(b) by 59 days.

(21) Appl. No.: 14/338,005

(22) Filed: Jul. 22, 2014

(65) Prior Publication Data

US 2016/0028393 A1     Jan. 28, 2016

(51) Int. Cl.
    *H03K 3/00*     (2006.01)
    *H03K 17/687*     (2006.01)
    *H03K 17/689*     (2006.01)

(52) U.S. Cl.
    CPC ........ *H03K 17/6877* (2013.01); *H03K 17/689* (2013.01); *H03K 2217/0009* (2013.01)

(58) Field of Classification Search
    CPC ................ H03K 17/6877; H03K 17/689
    USPC .............. 327/108–112; 326/82–84, 89
    See application file for complete search history.

(56) References Cited

U.S. PATENT DOCUMENTS

| | | | | |
|---|---|---|---|---|
| 4,449,174 A | * | 5/1984 | Ziesse ............. | H02M 3/155 323/222 |
| 4,575,642 A | * | 3/1986 | Hochreutiner ....... | H03K 17/689 326/23 |
| 6,094,087 A | * | 7/2000 | He ................ | H02M 1/4225 327/376 |
| 6,243,278 B1 | * | 6/2001 | Jacobs ............ | H02M 3/33592 363/127 |
| 6,657,266 B2 | | 12/2003 | Hirai et al. | |
| 7,425,846 B2 | * | 9/2008 | Kim .............. | G09G 3/296 326/109 |
| 8,324,957 B2 | * | 12/2012 | Thomas ........... | G05F 3/262 327/112 |
| 8,392,626 B2 | | 3/2013 | Wormmeester | |
| 8,816,725 B2 | * | 8/2014 | Steeneken ......... | H03K 17/102 327/108 |
| 2002/0146997 A1 | | 10/2002 | Koizumi et al. | |
| 2014/0091854 A1 | | 4/2014 | Murata | |
| 2014/0184309 A1 | * | 7/2014 | Steeneken ......... | H03K 17/689 327/434 |

FOREIGN PATENT DOCUMENTS

JP     H11195972 A     7/1999

OTHER PUBLICATIONS

Notification of Transmittal of the International Search Report and the Written Opinion of the International Searching Authority, or the Declaration dated Oct. 19, 2015 in connection with International Patent Application No. PCT/US2015/040101.

* cited by examiner

*Primary Examiner* — William Hernandez

(57) ABSTRACT

A field-effect transistor (FET) driver is provided that includes an input modulator and an isolating capacitor. The input modulator is configured to output an alternating current (AC) signal. The isolating capacitor is configured to receive the AC signal as an input and to store a charge based on the AC signal in a filter capacitor. The filter capacitor is configured to drive a capacitor-driven FET based on the stored charge.

20 Claims, 2 Drawing Sheets

FIELD-EFFECT TRANSISTOR DRIVER

TECHNICAL FIELD

This disclosure relates generally to transistors. More specifically, this disclosure relates to a field-effect transistor driver.

BACKGROUND

For conventional applications using potential-free contacts, PhotoMOS or solid-state relays are often implemented. However, these relays may be too slow for some applications to the field or may require their own isolated power source. A standard field-effect transistor (FET) driver could be implemented as an alternative in some applications. However, standard FET drivers add direct current to the field. Therefore, for applications in which direct current cannot be added to the field, standard FET drivers cannot be used as an alternative to PhotoMOS or solid-state relays.

SUMMARY

This disclosure provides a field-effect transistor (FET) driver.

In a first embodiment, a FET driver includes an input modulator and an isolating capacitor. The input modulator is configured to output an alternating current (AC) signal. The isolating capacitor is configured to receive the AC signal as an input, to store a charge based on the AC signal in a filter capacitor, and to drive a capacitor-driven FET based on the stored charge.

In a second embodiment, a FET driver includes an amplifier, an isolating capacitor, and a filter capacitor. The amplifier is configured to receive a clock signal and a digital signal and to generate an amplified output based on the clock signal and the digital signal. The isolating capacitor is configured to store a charge based on the amplified output in the filter capacitor. The filter capacitor is configured to drive a capacitor-driven FET based on the stored charge.

In a third embodiment, a field device includes a capacitor-driven FET, a load and a FET driver. The load and the FET driver are coupled to first and second nodes, respectively, of the capacitor-driven FET. The FET driver includes an isolating capacitor and is configured to drive the capacitor-driven FET without changing a direct current value of the load.

Other technical features may be readily apparent to one skilled in the art from the following figures, descriptions, and claims.

BRIEF DESCRIPTION OF THE DRAWINGS

For a more complete understanding of this disclosure, reference is now made to the following description, taken in conjunction with the accompanying drawings, in which.

DETAILED DESCRIPTION

FIGS. 1 through 3B, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

Figure 1:
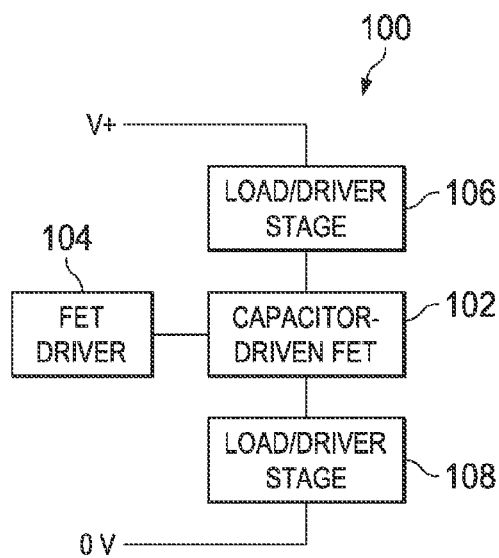
FIG. 1 illustrates a field device including a capacitor-driven field-effect transistor (FET) and a FET driver according to an embodiment of this disclosure.

FIG. 1 illustrates a field device 100 including a capacitor-driven field-effect transistor (FET) 102 and a FET driver 104 according to an embodiment of this disclosure. The embodiment of the field device 100 shown in FIG. 1 is for illustration only. Other embodiments of the field device 100 could be used without departing from the scope of this disclosure.

In addition to the capacitor-driven FET 102 and the FET driver 104, the field device 100 includes a load and a driver stage. For some embodiments, the load may be coupled to a high voltage $V_+$, while the driver stage is coupled to ground or 0V. For other embodiments, the driver stage may be coupled to the high voltage, while the load is coupled to ground. Thus, the illustrated embodiment includes a representation of a load/driver stage 106 and a load/driver stage 108 to indicate that one of these components 106 and 108 is a load and the other is a driver stage. Therefore, the load/driver function position is free and may swap positions during use.

The FET driver 104 is configured to drive the capacitor-driven FET 102 using an isolating capacitor (not shown in FIG. 1). The isolating capacitor prevents a direct current (DC) signal from reaching the capacitor-driven FET 102 and, thus, the load 106 or 108. Therefore, instead of an optical On/Off control of the capacitor-driven FET 102, the FET driver 104 is configured to implement a capacitor-coupled On/Off control of the capacitor-driven FET 102. Accordingly, instead of receiving photons, the FET driver 104 may be configured to receive an AC signal, such as a clock signal, and to turn the capacitor-driven FET 102 on and off by either applying or not applying the AC signal to the isolating capacitor.

In this way, the achieved switching speed for the capacitor-driven FET 102 is much higher compared to a PhotoMOS (for example, the speed may be more than 10 times faster), and the switching behavior and timing are better controlled and reproducible. In addition, because an isolating capacitor couples the FET driver 104 to the capacitor-driven FET 102, the FET driver 104 is configured to drive the capacitor-driven FET 102 without influencing the direct current (DC) values of the field loop, which may be used as a return path. This can be particularly useful with industrial field devices or other devices that use the DC value on a field loop to convey information.

Although FIG. 1 illustrates one example of a field device 100, various changes may be made to the embodiment of FIG. 1. For example, various components of the field device 100 could be combined, further subdivided, moved, or omitted and additional components could be added according to particular needs.

Figure 2A:
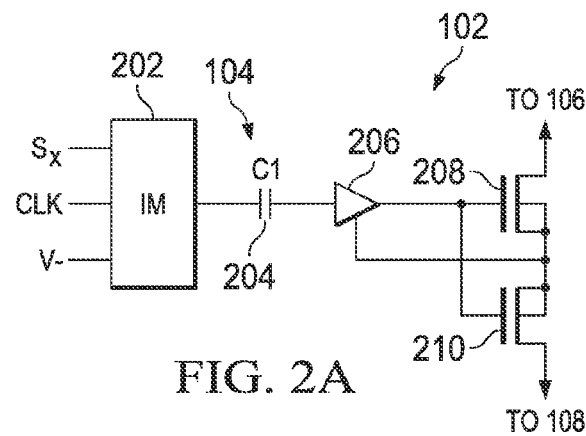
FIGS. 2A and 2B illustrate the capacitor-driven FET and FET driver of FIG. 1 according to embodiments of this disclosure.
Figure 2B:
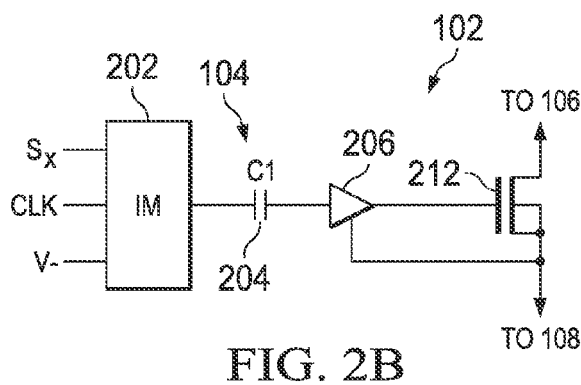

FIGS. 2A and 2B illustrate the capacitor-driven FET 102 and the FET driver 104 according to embodiments of this disclosure. The embodiments of the capacitor-driven FET 102 and the FET driver 104 shown in FIGS. 2A and 2B are for illustration only. Other embodiments of the capacitor-driven FET 102 and the FET driver 104 could be used without departing from the scope of this disclosure.

For the embodiment illustrated in FIG. 2A, the FET driver 104 includes an input modulator (IM) 202, an isolating capacitor 204, and a buffer 206. The input modulator 202, which may include an AND gate, is configured to receive a digital signal $S_x$, a clock signal Clk, and a low voltage signal.

The digital signal functions as an On/Off signal, and the clock signal provides an AC signal. When the digital signal is On, the output of the input modulator 202 is oscillating up and down with the frequency of the clock signal. Similarly, when the digital signal is Off, the output of the input modulator 202 is off or zero. Therefore, when the digital signal is On, energy is transferred to the isolating capacitor 204, and when the digital signal is Off, no energy is transferred to the isolating capacitor 204. The isolating capacitor 204 is configured to transfer the AC signal from the input modulator 202 to the FET-source side. The buffer 206 is configured to rectify and store the AC signal and to drive the capacitor-driven FET 102.

Also for the embodiment illustrated in FIG. 2A, the capacitor-driven FET 102 includes two series-coupled FETs 208 and 210 in a bipolar switch configuration. Thus, one node of the FET 208 is coupled to the load/driver stage 106, and one node of the FET 210 is coupled to the load/driver stage 108. Using the input modulator 202 and the isolating capacitor 204 in the FET driver 104 allows the capacitor-driven FET 102 to switch faster compared to a PhotoMOS relay and also to be less expensive.

For the embodiment illustrated in FIG. 2B, the FET driver 104 is configured the same as the FET driver 104 of FIG. 2A. However, the capacitor-driven FET 102 in this embodiment includes a single FET 212 in a unipolar switch configuration. Thus, one node of the FET 212 is coupled to the load/driver stage 106, and another node of the FET 212 is coupled to the load/driver stage 108.

Although FIGS. 2A and 2B illustrate examples of a capacitor-driven FET 102 and a FET driver 104, various changes may be made to the embodiments of FIGS. 2A and 2B. For example, various components could be combined, further subdivided, moved, or omitted and additional components could be added according to particular needs. As a specific example, the buffer 206 may include additional components to reduce the actual switch-On and/or switch-Off transfer time.

Figure 3A:
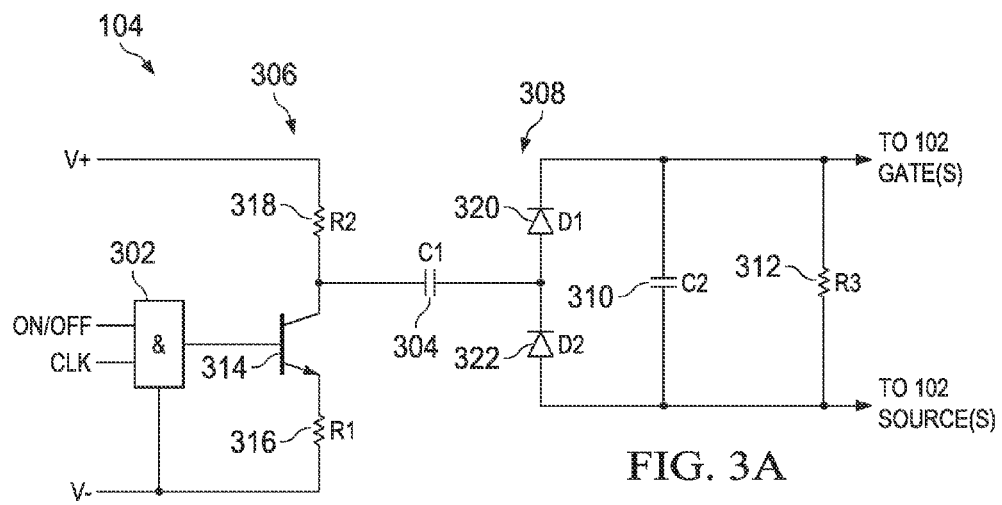
FIGS. 3A and 3B illustrate the FET driver of FIG. 1 according to embodiments of this disclosure.
Figure 3B:
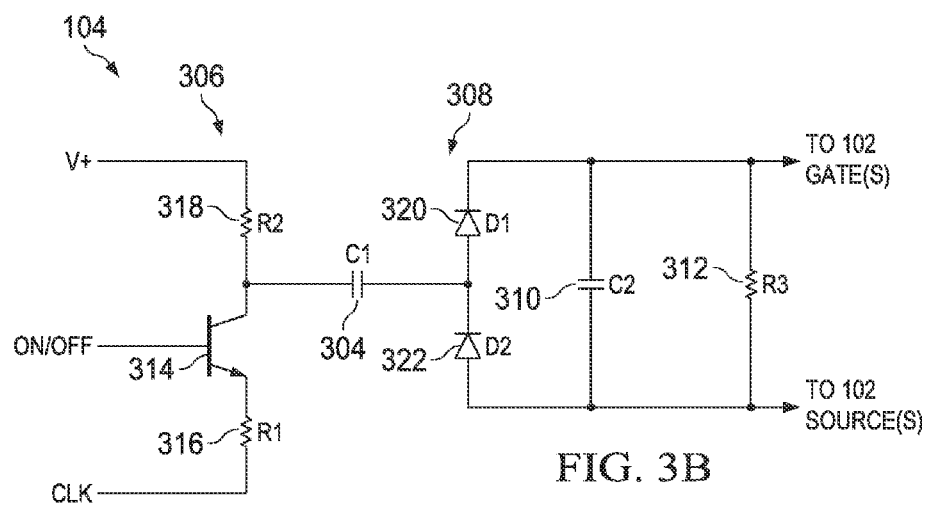

FIGS. 3A and 3B illustrate the FET driver 104 according to embodiments of this disclosure. The embodiments of the FET driver 104 shown in FIGS. 3A and 3B are for illustration only. Other embodiments of the FET driver 104 could be used without departing from the scope of this disclosure.

For the embodiment illustrated in FIG. 3A, the FET driver 104 includes an AND gate 302, an amplifier 306, an isolating capacitor 304, a rectifier 308, a filter capacitor 310, and a discharge resistor 312. The amplifier 306 includes a transistor 314, a resistor 316, and a resistor 318. The rectifier 308 includes two diodes 320 and 322.

The AND gate 302 is configured to function as an input modulator. The amplifier 306 is configured to amplify the output of the AND gate 302 by using an amplification factor based on the ratio $R_2/R_1$, where $R_1$ is the resistance of the resistor 316 and $R_2$ is the resistance of the resistor 318. In this way, the rectified voltage on the filter capacitor 310 can be made high enough to drive the gate of the capacitor-driven FET 102. The rectifier 308 is configured to rectify the oscillating signal output from the isolating capacitor 304 and to charge the filter capacitor 310 using the rectified signal. When sufficient voltage is stored on the filter capacitor 310, the capacitor-driven FET 102 is switched on. To switch off the capacitor-driven FET 102, the On/Off signal to the AND gate 302 is turned off so that the isolating capacitor 304 receives no charge. In this situation, the discharge resistor 312 is configured to discharge the voltage stored on the filter capacitor 310.

In this way, an AC signal (such as the clock signal Clk) may be switched on or off with an On/Off signal at the AND gate 302, transferred through the isolating capacitor 304 to remove any DC current, rectified by the rectifier 308, and stored on the filter capacitor 310 to drive the gate of the capacitor-driven FET 102 without changing the DC value of the field current. Thus, when speed is desired, the FET driver 104 may be implemented to provide relatively fast switching without interrupting the DC current flowing through the load 106 or 108.

For the embodiment illustrated in FIG. 3B, the FET driver 104 is similar to the FET driver 104 of FIG. 3A. However, for this embodiment, the AND gate 302 is omitted from the FET driver 104. For this example, the On/Off signal is applied to the base of the transistor 314 instead of to an AND gate. Also, instead of applying the clock signal to an AND gate and the low voltage signal $V_-$ to the resistor 316, the clock signal is applied to the resistor 316.

Although FIGS. 3A and 3B each illustrate one example of a FET driver 104, various changes may be made to the embodiments of FIGS. 3A and 3B. For example, various components of either of these FET drivers 104 could be combined, further subdivided, moved, or omitted and additional components could be added according to particular needs. In particular, for one example, the filter capacitor 310 may be optional. The gate-to-source capacitance of the capacitor-driven FET 102 may provide the capacitance otherwise provided by the filter capacitor 310. In addition, for more control of the switch-On delay and/or the switch-Off delay, additional components may be included on the capacitor-driven FET side of the isolating capacitor 304.

It may be advantageous to set forth definitions of certain words and phrases used throughout this patent document. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of A, B, and C" includes any of the following combinations: A, B, C, A and B, A and C, B and C, and A and B and C.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A field-effect transistor (FET) driver comprising:
   an input modulator configured to output an alternating current (AC) signal;
   an amplifier configured to amplify the AC signal; and
   an isolating capacitor configured to receive the amplified AC signal as an input, to store a charge based on the amplified AC signal in a filter capacitor, and to drive a capacitor-driven FET based on the stored charge;
   wherein the amplifier comprises a first resistor, a second resistor, and a transistor;

wherein the first and second resistors are coupled to different terminals of the transistor; and
wherein the first resistor is configured to receive a clock signal.

2. The FET driver of claim 1, wherein:
the capacitor-driven FET comprises a FET coupled between a load and a driver stage, and
a first node of a rectifier is coupled to the isolating capacitor, a second node of the rectifier is coupled to a gate of the FET, and a third node of the rectifier is coupled to a source of the FET.

3. A field-effect transistor (FET) driver comprising:
an input modulator configured to output an alternating current (AC) signal; and
an isolating capacitor configured to receive the AC signal as an input, to store a charge based on the AC signal in a filter capacitor, and to drive a capacitor-driven FET based on the stored charge;
wherein the input modulator comprises an AND gate configured to receive a clock signal and a digital signal and to pass the clock signal based on the digital signal to generate the AC signal.

4. A field-effect transistor (FET) driver comprising:
an input modulator configured to output an alternating current (AC) signal;
an amplifier configured to amplify the AC signal; and
an isolating capacitor configured to receive the amplified AC signal as an input, to store a charge based on the amplified AC signal in a filter capacitor, and to drive a capacitor-driven FET based on the stored charge;
wherein:
the capacitor-driven FET comprises a first FET and a second FET coupled in series between a load and a driver stage, and
a first node of a rectifier is coupled to the isolating capacitor, a second node of the rectifier is coupled to a gate of the first FET and a gate of the second FET, and a third node of the rectifier is coupled to a source of the first FET and a source of the second FET.

5. A field-effect transistor (FET) driver comprising:
an amplifier configured to receive a clock signal and a digital signal and to generate an amplified output based on the clock signal and the digital signal;
a filter capacitor configured to drive a capacitor-driven FET based on a charge; and
an isolating capacitor configured to store the charge in the filter capacitor based on the amplified output.

6. The FET driver of claim 5, further comprising:
a rectifier configured to rectify an output of the isolating capacitor to generate a rectified output,
wherein the filter capacitor is further configured to drive the capacitor-driven FET based on the rectified output.

7. The FET driver of claim 6, wherein the rectifier comprises two diodes.

8. The FET driver of claim 5, further comprising:
an input modulator configured to provide the clock signal and the digital signal to the amplifier.

9. The FET driver of claim 5, further comprising:
a discharge resistor configured to discharge the charge from the filter capacitor.

10. The FET driver of claim 5, wherein the amplifier comprises a first resistor, a second resistor, and a transistor.

11. The FET driver of claim 10, wherein:
the first resistor is coupled between an emitter of the transistor and the clock signal, and
the second resistor is coupled between a high voltage and a collector of the transistor.

12. The FET driver of claim 10, wherein:
the first resistor is coupled between an emitter of the transistor and a low voltage, and
the second resistor is coupled between a high voltage and a collector of the transistor.

13. The FET driver of claim 10, wherein a node of the isolating capacitor is coupled between the second resistor and a collector of the transistor.

14. A field device comprising:
a capacitor-driven field-effect transistor (FET);
a load coupled to a first node of the capacitor-driven FET; and
a FET driver coupled to a second node of the capacitor-driven FET, wherein the FET driver comprises an isolating capacitor, and wherein the FET driver is configured to drive the capacitor-driven FET without changing a direct current value of the load;
wherein the FET driver further comprises an amplifier configured to receive a clock signal and a digital signal and to generate an amplified output based on the clock signal and the digital signal.

15. The field device of claim 14, wherein the isolating capacitor is configured to receive an alternating current (AC) signal as an input, to store a charge based on the AC signal in a filter capacitor, and to drive the capacitor-driven FET based on the stored charge; and
wherein the AC signal comprises the amplified output from the amplifier.

16. The field device of claim 14, wherein the FET driver further comprises:
a filter capacitor configured to drive the capacitor-driven FET based on a charge, wherein the isolating capacitor is configured to store the charge in the filter capacitor based on the amplified output.

17. The field device of claim 16, wherein:
the FET driver further comprises a rectifier configured to rectify an output of the isolating capacitor to generate a rectified output, and
the filter capacitor is further configured to drive the capacitor-driven FET based on the rectified output.

18. The field device of claim 17, wherein the FET driver further comprises a discharge resistor configured to discharge the charge from the filter capacitor.

19. The field device of claim 14, wherein:
the amplifier comprises a first resistor, a second resistor and a transistor,
the first resistor is coupled between an emitter of the transistor and a low voltage,
the second resistor is coupled between a high voltage and a collector of the transistor, and
a node of the isolating capacitor is coupled between the second resistor and the collector of the transistor.

20. The field device of claim 14, wherein:
the amplifier comprises a first resistor, a second resistor and a transistor,
the first resistor is coupled between an emitter of the transistor and a clock signal,
the second resistor is coupled between a high voltage and a collector of the transistor, and
a node of the isolating capacitor is coupled between the second resistor and the collector of the transistor.

* * * * *